(12) United States Patent
Moos

(10) Patent No.: US 12,742,253 B2
(45) Date of Patent: Sep. 22, 2026

(54) DEVICE AND METHOD FOR PRODUCING A MONOCRYSTALLINE SILICON ROD IN A ZONE-MELTING PULLING SYSTEM

(71) Applicant: SILTRONIC AG, Munich (DE)

(72) Inventor: Patrick Moos, Pleiskirchen (DE)

(73) Assignee: SILTRONIC AG, Munich (DE)

( * ) Notice: Subject to any disclaimer, the term of this patent is extended or adjusted under 35 U.S.C. 154(b) by 298 days.

(21) Appl. No.: 18/550,134

(22) PCT Filed: Mar. 1, 2022

(86) PCT No.: PCT/EP2022/055084

§ 371 (c)(1),
(2) Date: Sep. 12, 2023

(87) PCT Pub. No.: WO2022/194533

PCT Pub. Date: Sep. 22, 2022

(65) Prior Publication Data

US 2024/0309540 A1 Sep. 19, 2024

(30) Foreign Application Priority Data

Mar. 15, 2021 (EP) .................................... 21162639

(51) Int. Cl.
*C30B 13/28* (2006.01)
*C30B 29/06* (2006.01)

(52) U.S. Cl.
CPC ............ *C30B 13/285* (2013.01); *C30B 29/06* (2013.01)

(58) Field of Classification Search
CPC ....... C30B 13/285; C30B 13/32; C30B 29/06; C30B 35/00
See application file for complete search history.

(56) References Cited

U.S. PATENT DOCUMENTS 3,159,408 A 12/1964 Sanchez et al.
3,494,742 A * 2/1970 Lagarde, Jr. ............ C30B 13/20 117/933

(Continued)

FOREIGN PATENT DOCUMENTS

CN 211256149 U 8/2020
JP 2002047090 A 2/2002

(Continued)

*Primary Examiner* — Hua Qi

(74) *Attorney, Agent, or Firm* — LEYDIG, VOIT & MAYER, LTD.

(57) ABSTRACT

A device holds a feed rod in a pulling installation for zone melting. The device has an upper part, a lower part, and three length-adjustable spacer elements. The upper part includes a connecting element, which serves for the fitting into the pulling installation; and a radial alignment element that radially aligns the upper part in the pulling installation. The lower part has three gripping arms. The three gripping arms are formed such that one end fits into a groove in the lateral surface of the feed rod and another end is attached rotatably. The length-adjustable spacer elements are attached to the upper part such that they exert force respectively onto a gripping arm. The upper part and the lower part are connected by a bearing. The bearing has the effect that a connection is radially with a form fit in a self-centering and detachable manner with respect to one another.

11 Claims, 5 Drawing Sheets

(56) References Cited

U.S. PATENT DOCUMENTS 5,935,321 A * 8/1999 Chiou .................... C30B 15/22
117/911
2007/0044711 A1 3/2007 Knerer

FOREIGN PATENT DOCUMENTS

JP 2019167254 A 10/2019
KR 20070024394 A 3/2007

* cited by examiner

DEVICE AND METHOD FOR PRODUCING A MONOCRYSTALLINE SILICON ROD IN A ZONE-MELTING PULLING SYSTEM

CROSS REFERENCE TO RELATED APPLICATIONS

This application is a U.S. National Phase application under 35 U.S.C. § 371 of International Application No. PCT/EP2022/055084, filed on Mar. 1, 2022, and claims benefit to European Patent Application No. EP 21162639.5, filed on Mar. 15, 2021. The International Application was published in German on Sep. 22, 2022 as WO 2022/194533 A1 under PCT Article 21(2).

FIELD

The subject matter of the present disclosure is related to a device and a method for producing a monocrystalline rod from silicon in a zone pulling installation using an azimuthally grooved feed rod.

BACKGROUND

On an industrial scale, zone pulling is used in particular for producing single crystals from silicon. This involves obtaining a single crystal from a polycrystalline feed rod, though optionally a feed rod of monocrystalline silicon can also be used.

For this purpose, the feed rod is incipiently melted at one end with the aid of a radio-frequency coil (inductor) and a monocrystalline seed crystal is attached to the resulting melt droplet. Material progressively melted from the feed rod serves as a supply for a single crystal subsequently growing on the seed crystal. A section of length referred to as a thin neck (neck) is firstly crystallized, in order to divert dislocations from the crystal lattice. Subsequently, the diameter of the growing single crystal is increased to a desired diameter in a section of length referred to as the initial cone (seed cone). After that, a section of length in which the single crystal has the desired diameter is produced. To complete the method, a section of length referred to as the end cone is produced. Optionally, the method may also be completed without an end cone, though then a part at the end of the section of length with the desired diameter is unusable for the intended further processing because it has dislocations.

The feed rod is in this case mounted with one end on a rotatable shaft (pulling shaft) in such a way that it does not slip-even if the direction of rotation changes abruptly. There is also the requirement that the middle of the other end of the feed rod is at all times on the axis of rotation of the pulling shaft during the crystal pulling. If the center of the other end were to move away from the axis of rotation of the pulling shaft, that would lead to considerable influencing of the melting by the pulling coil, which in turn may adversely influence the entire pulling process.

This effect can be very easily observed if the frequency of the radio-frequency coil (pulling coil) is measured as a function of time, since the frequency is load-dependent, and is consequently a function of the distance of the feed rod from the coil.

Currently available on the market are monocrystalline rods of silicon with a diameter of nominally up to 200 mm that have been produced by the zone pulling process. In addition to the length of the rod to be pulled, the target diameter of the monocrystalline rod in this case determines of course the weight of the feed rod necessary for this.

The development toward longer monocrystalline rods for increasing the yield and also the development toward greater diameters of the monocrystalline rod therefore necessarily require a greater weight of the respective feed rod that is fitted into the pulling installation and has to be both precisely and securely held there on the pulling shaft.

Patent application JP 2019 167 254 A2 describes for example a device for holding a feed rod in an installation for zone melting which includes a connecting element between the pulling shaft and the feed rod, a multiplicity of locking parts, a horizontal positioning part for setting the horizontal position of the feed rod and a shielding part for shielding from radiant heat.

SUMMARY

In an embodiment, the present disclosure provides a device that holds a feed rod in a pulling installation for zone melting. The device includes an upper part, a lower part, and three length-adjustable spacer elements. The upper part includes a connecting element, which serves for the fitting into the pulling installation; and a radial alignment element configured to radial align the upper part in the pulling installation. The lower part has three gripping arms. The three gripping arms are formed in such a way that one end fits into a groove in the lateral surface of the feed rod, and another end is attached rotatably. The length-adjustable spacer elements are attached to the upper part in such a way that they are configured to exert force respectively onto a gripping arm, of the gripping arms. The upper part and the lower part are connected by a bearing. The bearing has the effect that a connection is radially with a form fit in a self-centering and detachable manner with respect to one another.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

The device described in the above-cited prior art is suitable, in principle, for positioning feed rods in an installation for zone pulling. However, in particular when using feed rods of a very high weight and great lengths, it has been found that the fitting proves to be too insecure, and consequently also too imprecise. Moreover, the device is not easy to attach, and so the heavy feed rod has to be introduced into the pulling installation and fixed there in a way that is complicated and usually entails risk. The second disadvantage is that there is no possibility of setting the angle of the feed rod with regard to its ideal line in the pulling installation, or this can only be optimized with great difficulty, which has the result that the yield of the pulled rods is reduced.

After analyzing the problems mentioned, the inventor realized that a preferred solution to the problems mentioned is to design a device for holding the feed rod in such a way that it is made up of at least two parts, with one part (referred to herein as the lower part) being able to be mounted on the rod while it is still outside the crystal pulling installation. The second part of the device (referred to herein as the upper part) is securely mounted on the pulling shaft in the crystal pulling installation.

The present disclosure, therefore, provides an improved form of the device over the prior art that does not have the aforementioned disadvantages.

The present disclosure also provides a method for fitting a feed rod that is capable of also fitting very heavy feed rods securely and precisely into the zone pulling installation.

The features specified with regard to the embodiments set out herein of the method according to the present disclosure can be correspondingly applied to the products according to the present disclosure. Conversely, the features specified with regard to the embodiments set out herein of the products according to the present disclosure can be correspondingly applied to the method according to the present disclosure. These and other features of the embodiments according to the present disclosure are explained in the description of the figures and in the claims. The individual features can be realized either separately or in combination as embodiments of the present disclosure. Furthermore, they can describe advantageous embodiments which are independently protectable. Exemplary embodiment will now be described in connection with the figures to further elucidate the features and advantages of aspects of the present disclosure.

Figure 1:
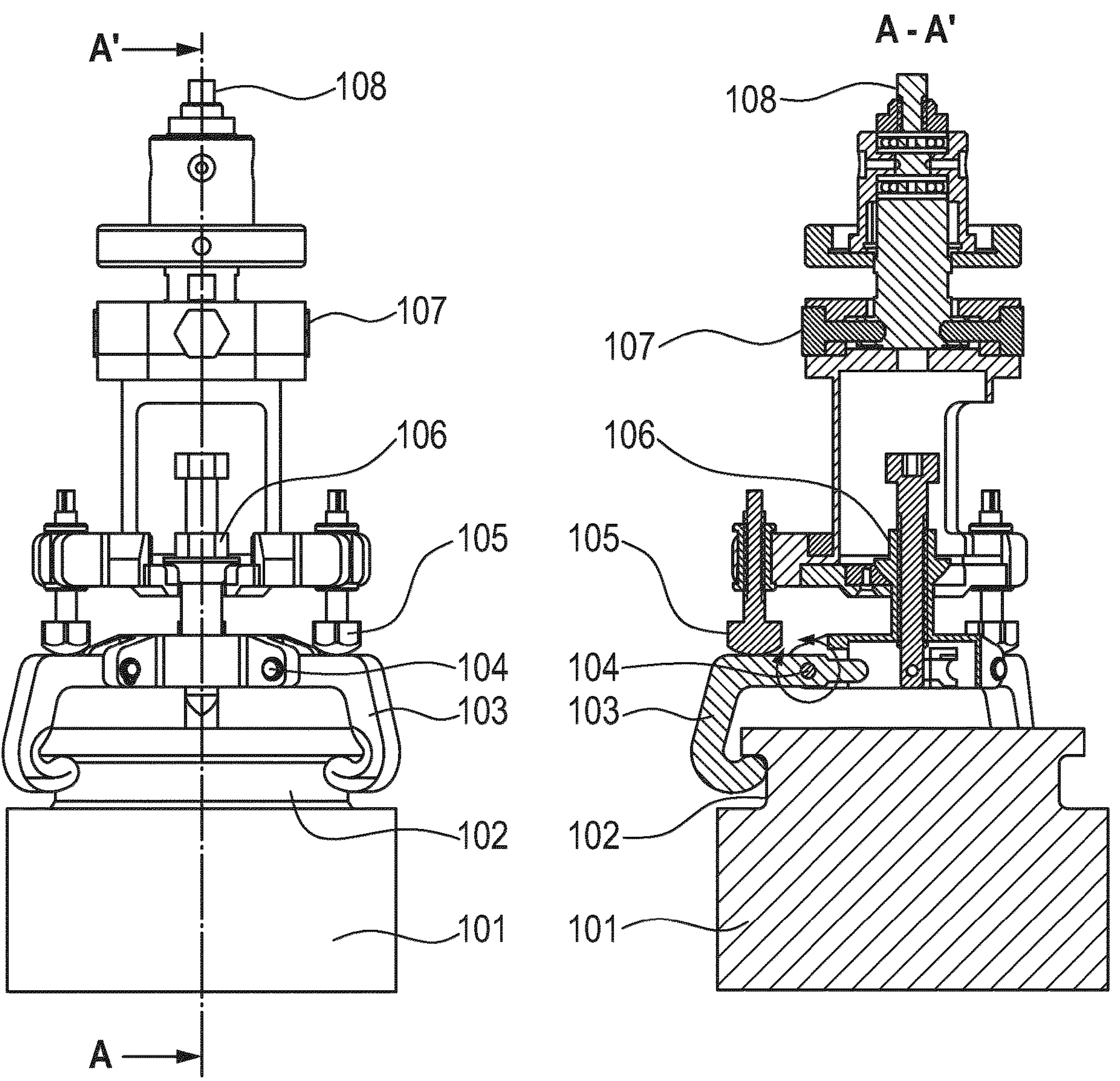
FIG. 1 shows an exemplary embodiment, implemented according to the present disclosure, of an arrangement for holding a feed rod in a crystal pulling installation for zone pulling.

FIG. 1 shows an exemplary embodiment according to the present disclosure of an arrangement for holding a feed rod (101) in a crystal pulling installation for zone pulling.

A connecting element (108) lying on top in the form of an adapter, which is attached to the pulling shaft, holds an element for radial alignment of the device (107). The connecting element (108) is, in a preferred embodiment, designed in such a way that it can be screwed onto the pulling shaft by means of a thread, while at the same time it is secured by bolts, so that the thread cannot be undone of its own accord due to a sudden change in the direction of rotation of the arrangement as a whole.

Subsequently, an element for radial alignment (107) of the arrangement is attached. It comprises for example linear guides which ensure that a radial alignment of the arrangement can be carried out.

Three grippers (103) hold by one end an azimuthal groove (102) of the feed rod (101), the groove being provided in the vicinity of the end of the feed rod.

Figure 2:
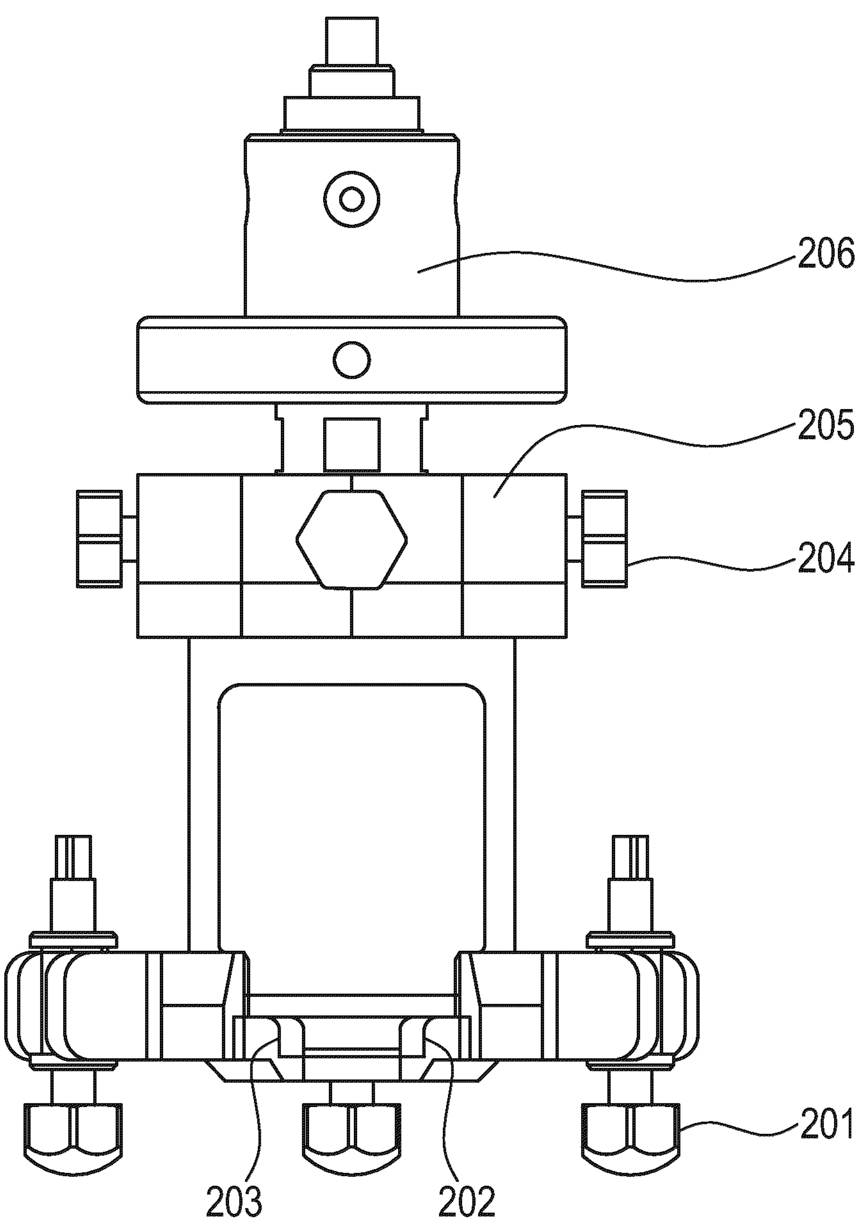
FIG. 2 shows an upper part of a configuration according to the present disclosure of the device.

The gripping arms or grippers (103) are in this case attached to a lower part of the device by means of bolts or splints (104) in such a way that they can rotate and thus can grip the feed rod. With the aid of screws (105), which are attached to the upper part in such a way that they can exert force on the grippers, the feed rod (101) can on the one hand be fixed and on the other hand be aligned in such a way that the remote end of the feed rod (101) is aligned exactly centrally;

FIG. 2 shows the upper part of a configuration of the device according to the present disclosure. The upper part may be screwed onto the pulling shaft by way of an adapter (206) and secured by way of bolts. Securing by means of bolts is appropriate because the overall arrangement is subjected to rapid changes of rotation, and so it is prevented from coming loose of its own accord.

Subsequently, an element for radial alignment (205) of the arrangement is attached. It comprises for example linear guides which ensure that a radial alignment of the arrangement can be carried out. The linear guides can be operated by screws (204).

Figure 3:
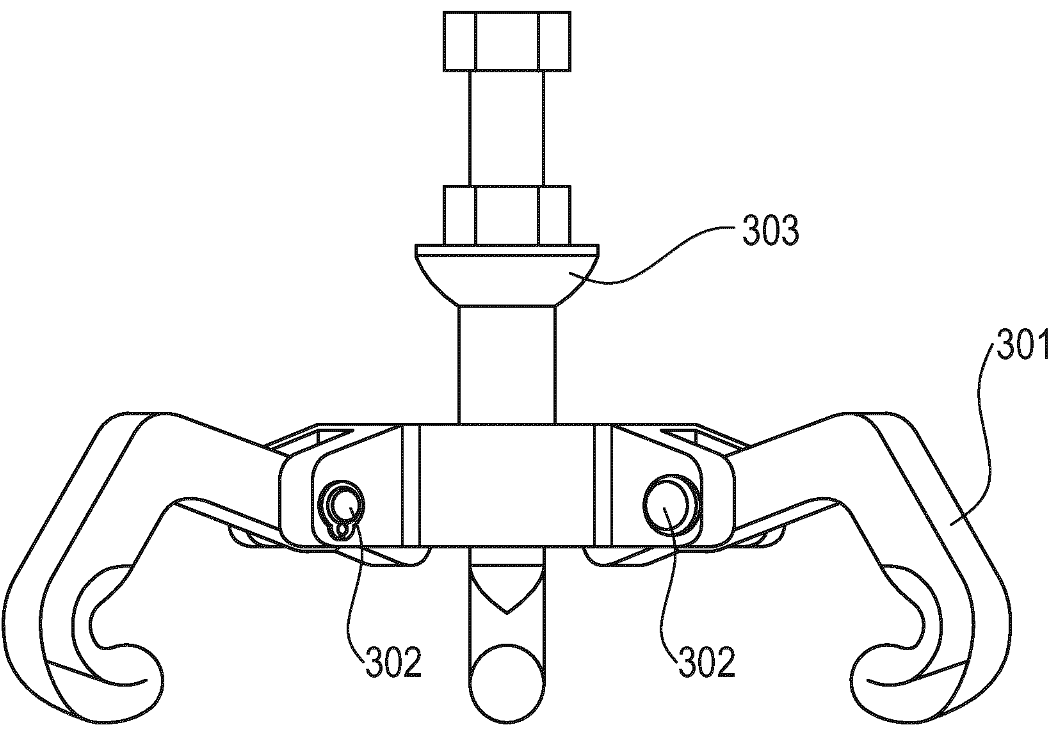
FIG. 3 shows a lower part of a configuration of the device according to the present disclosure of the device.

The upper part also comprises a bearing (203), which serves for easily suspending a lower part. To be able to suspend the lower part, a corresponding opening in the upper part (202) is necessary. The upper part also comprises length-adjustable spacer elements (201), which are attached in such a way that they can exert force on gripping arms that are fastened to the lower part. A simple exemplary embodiment of a spacer element is a screw that is provided with counter nuts;

FIG. 3 shows the lower part of a configuration of the device according to the present disclosure. Three gripping arms or grippers (301) are attached by means of bolts or rivets (302) in such a way that they can rotate and thus engage in the groove of the feed rod. The rotation of the gripping arms can in this case be set and fixed by a screw mechanism.

Figure 4:
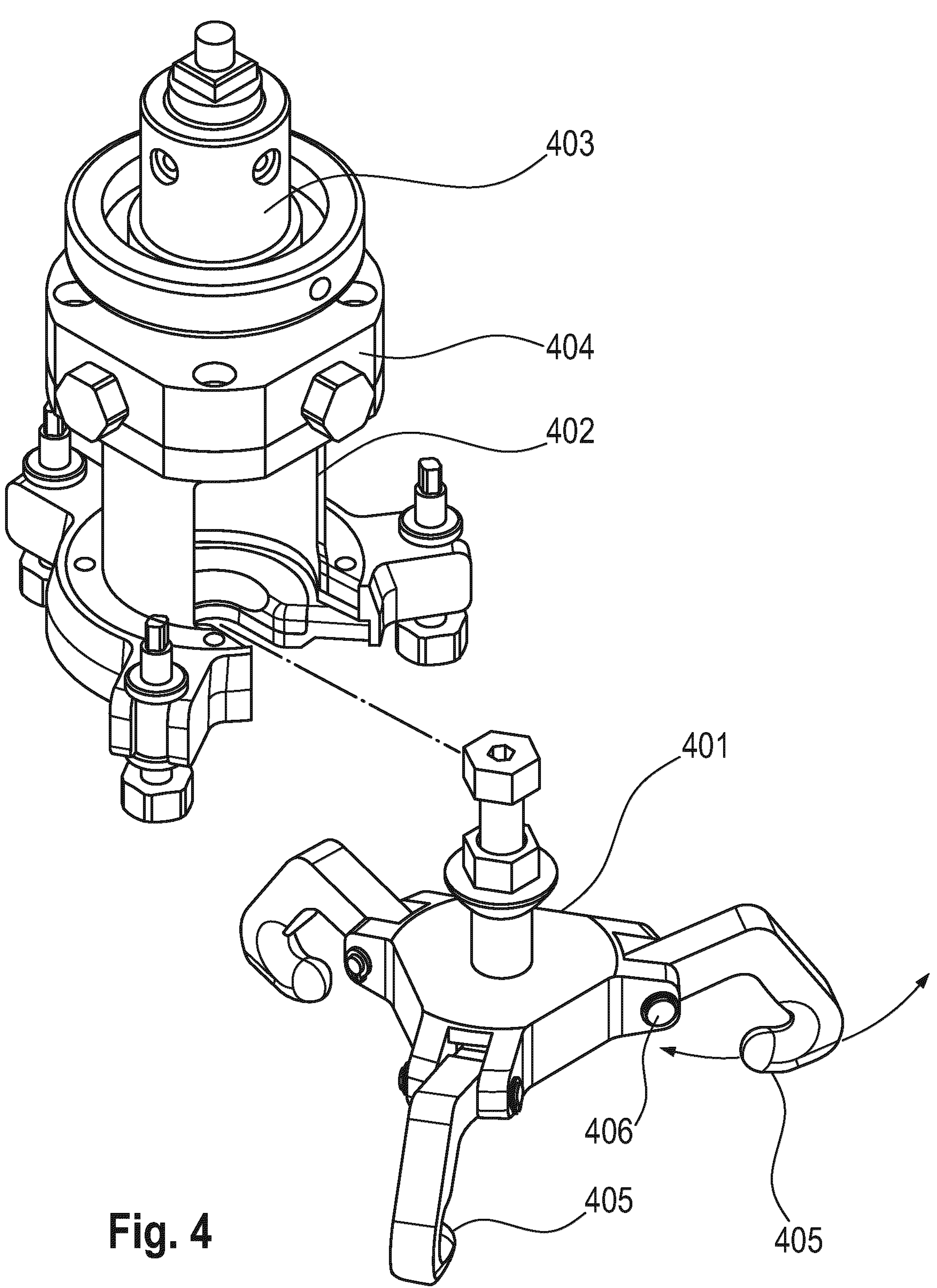
FIG. 4 shows, by way of example, how the lower part can be suspended in the upper part.
Figure 5:
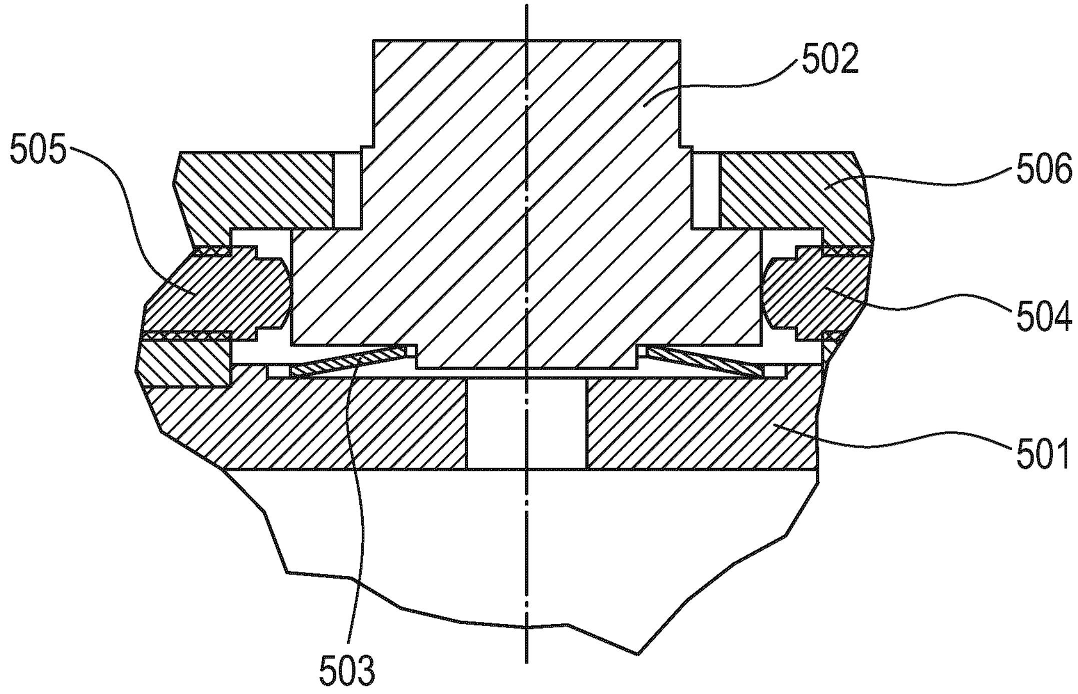
FIG. 5 shows, in the detail, an exemplary embodiment, implemented according to the present disclosure, of the element for radial alignment of the device in the pulling installation.

The lower part comprises a counter bearing (303), so that it can be easily suspended on the upper part. In a preferred embodiment, the grippers or gripping arms (301) are produced monolithically from one piece;

FIG. 4 shows by way of example how the lower part (401) can be suspended in the upper part (402). The upper part in this case comprises a connecting element (403), which can be connected to the pulling shaft, and an element for radial alignment by means of a linear guide (404), with the aid of which the device can be radially aligned. The lower part, which is suspended in the upper part, comprises movable gripping arms (405), which are attached by means of rivets or splints secured by snap rings; and FIG. 5 shows in the detail an exemplary embodiment, implemented according to the present disclosure, of the element for radial alignment of the device in the pulling installation (linear guide). One or more leaf springs (503), which bear the connecting element (502), rest on a base plate (501). By way of a screw (504), the connecting element (502) can be precisely adjusted horizontally in such a way that the position of the rod suspended in the device meets the specifications. A screw (505) is in this case used for countering the linear guide, in order to secure the position that has been set.

For clarity, the pulling shaft is the term used for the device that essentially performs two tasks in the pulling installation: (1) it ensures that the feed rod fastened to it is held while it possibly undergoes changing rotational speeds and/or directions of rotation and (2) the feed rod can be moved axially at a previously fixed (or possibly changing) speed.

The feed rod in this case supplies the material from which the later single crystal is to be produced. For pulling a single crystal from silicon, for example a polycrystalline feed rod of silicon is used. It goes without saying that a monocrystalline crystal, which for example is pulled by means of a Czochralski pulling process, can also be used as the feed rod. It is also possible to use other semiconductor materials for the feed rod.

It is essential, for the preferred embodiment, for the feed rod that it has the form of a cylinder, its lateral surface having in the vicinity of one side (upper side) a groove which is dimensioned in such a way that the feed rod can be held without breaking out. FIG. 1 shows in this respect by way of example a feed rod (101) with a correspondingly formed groove (102).

The weight of a feed rod may vary depending on the desired diameter and the length of the monocrystalline rod. A typical weight for monocrystalline rods of silicon may in this case be much more than 100 kg and in some cases even more than 200 kg.

The fixing of such a heavy feed rod in a pulling installation by the means available in the prior art is difficult and time-insensitive and entails risks. The weight of the feed rod must in this case be kept precisely upright in the pulling installation as long as it takes until it is mounted and aligned on the pulling shaft.

If the alignment takes place inadequately, this can lead to oscillation of the emitter frequency during the crystal pulling, which often leads to rod failure (breakage, or dislocation).

The inventor has realized that, for preferred embodiments, a lower part of a device according to the present disclosure is first attached to the feed rod while the feed rod is still outside the pulling installation. In particularly preferred embodiment, the feed rod is in this case horizontal.

The lower part of the device according to the present disclosure (as shown for example in the preferred embodiment of FIG. 3) includes in this case three gripping arms or grippers (301), which are attached to the device by means of bolts or rivets (302) in such a way that they can rotate.

When the lower part is attached to the feed rod, the grippers (301, 103) engage in the groove (102) of the feed rod (101) and fix it there.

In the center of the lower part there is an adjusting screw, which can be used for opening or closing all of the gripping arms simultaneously. With the aid of this adjusting screw, the lower part is fastened to the feed rod by way of the gripping arms.

The feed rod may be, in a preferred embodiment, fitted into the pulling installation together with the lower part of the device mounted on it.

In this case, the counter bearing (303) of the lower part is first suspended in a bearing of the upper part (203). This bearing may be, in a preferred embodiment, configured in such a way that the lower part can be easily suspended, in particular a corresponding opening in the upper part (202) is necessary for this, which allows lateral access for this.

The lower part is consequently connected to the upper part radially with a form fit, the bearing used having the effect that the parts are additionally connected to one another in a self-centering and also detachable manner.

The upper part, in a preferred embodiment, comprises an element which serves for the radial alignment of the feed rod. The upper part, in a preferred embodiment, includes a linear guide with the aid of which the feed rod can be set in such a way that the axis of rotation of the pulling shaft coincides with the axis of rotation of the feed rod. The linear guide is, in this preferred embodiment, arranged in such a way that the path of movement is perpendicular to the axis of rotation of the pulling shaft.

When setting up, in a preferred embodiment, the linear guide is first used to set up the feed rod in such a way that the axis of rotation of the groove located in the feed rod coincides with the axis of rotation of the pulling shaft. The desired position of the linear guide may be subsequently secured by the countering screws (505) located in the device. The success of the measure can be checked for example by rotating the pulling shaft with the feed rod fastened to it and at the same time checking the concentricity.

The upper part likewise, in a preferred embodiment, comprises length-adjustable spacer elements (105), such as for example screws, which are attached in such a way that they can exert force on the gripping arms (103), which are fastened to the lower part.

The setting of these length-adjustable spacer elements (201) has the effect that the feed rod can be aligned along its axis. The feed rod is in this case preferably set up in such a way that the axis of rotation of the pulling shaft coincides with the axis of rotation of the feed rod. In particular, it is ensured that the axis of rotation at the end of the feed rod opposite from the groove coincides with the axis of rotation of the pulling shaft. This can be checked by checking the concentricity.

FIG. 1 shows two views of a feed rod (101), which is clamped in the device according to the present disclosure.

Once the feed rod has been inserted, the installation can be closed and the crystal pulling commenced, by first pulling an initial cone which, after reaching a target diameter, goes over into a cylindrical part. After reaching a desired length of the monocrystalline rod, an end cone is pulled. After completing the crystal pulling, the monocrystalline rod can be removed from the installation and a new feed rod prepared.

Ideally, during the crystal pulling of a first crystal, a feed rod is already attached to a lower part as provided by the present disclosure, which further reduces the setting-up times of the installation considerably.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

DESIGNATIONS

101 Feed rod. The feed rod may consist of polycrystalline or monocrystalline semiconductor material.

102 Azimuthal groove on one side of a feed rod (101). In the example shown, the groove is asymmetrically formed, that is to say the diameter of the feed rod differs on the left and right of the groove.
103 Gripping arm, which is formed in such a way that one end fits into the azimuthal groove of the feed rod (102), and another end is fastened rotatably to the lower part.
104 Rivets, on which one end of the gripping arm is attached in such a way that the gripping arm can turn.
105 Screw (a length-adjustable spacer element is attached to the upper part in such a way that it can exert force on a gripping arm)
106 Connected to one another in a self-centering and detachable manner
107 Element for radial alignment
108 Connecting element lying on top
201 Screw (a length-adjustable spacer element is attached to the upper part in such a way that it can exert force on a gripping arm)
202 Opening, to allow the lower part to be suspended
203 Bearing for the lower part
204 Screws for horizontal adjustment in the linear guide
205 Element for radial alignment by means of a linear guide
206 Connecting element lying on top
301 Gripping arm
302 Rivet or splint secured by snap ring
303 Counter bearing to suspend the lower part in the upper part
401 Lower part
402 Upper part
403 Connecting element lying on top
404 Element for radial alignment by means of a linear guide
405 Movable gripping arms
406 Rivet or splint secured by snap ring
501 Base plate
502 Connecting element
503 Leaf spring
504 Screw for horizontal adjustment in the linear guide
505 Screw for countering the linear guide
506 Covering

The invention claimed is:

1. A method for pulling a monocrystalline rod from silicon in a pulling installation for zone melting, the method comprising:

providing a feed rod of silicon, which at one end comprises a groove in a lateral surface;

attaching a lower part of a device to the feed rod, the lower part comprising three gripping arms, each of the gripping arms being formed in such a way that one end fits into the groove of the feed rod and another end is attached rotatably to a central body of the lower part, suspending the lower part together with the feed rod on an upper part of the device, the upper part comprising:

a connecting element, which is connected to a pulling shaft of the pulling installation;

a bearing configured to support the lower part so that, while the lower part is attached to the upper part, the upper part and the lower part are connected to one another by the bearing which has the effect that the connection is radially with a form fit and in a self-centering manner;

a radial alignment element; and three length-adjustable spacer elements arranged in the upper part in such a way that the length-adjustable spacer elements are configured to exert force respectively onto a corresponding gripping arm of the gripping arms while the lower part is suspended from the upper part;

moving the radial alignment element so that an axis of rotation of the feed rod at the one end at which the groove is located coincides with an axis of rotation of the pulling shaft;

setting the length-adjustable spacer elements so that the axis of rotation of the feed rod at an end opposite from the groove coincides with the axis of rotation of the pulling shaft;

pulling a conical part of the monocrystalline rod; and pulling a cylindrical part of the monocrystalline rod.

2. The method as claimed in claim 1, wherein the radial alignment element comprises linear guides, which are arranged in such a way that the respective linear guidance is configured take place perpendicularly to the pulling shaft.

3. The method as claimed in claim 2, wherein the linear guide comprises:

one or more leaf springs, which bear on the connecting element, and rest on a base plate; and one or more screws configured to adjustably engage with the connecting element to set the relative horizontal position of the connecting element to the radial alignment element.

4. The method as claimed in claim 1, wherein the three gripping arms have been produced monolithically from one piece.

5. The method as claimed in claim 1, wherein each of the length-adjustable spacer elements comprises a screw with a counter nut.

6. The method as claimed in claim 1, wherein the attaching of the lower part to the feed rod takes place outside of the crystal pulling installation while the lower part is separated from the upper part, the upper part being securing mounted on the pulling shaft in the pulling installation.

7. The method as claimed in claim 6, wherein the attaching of the lower part of the feed rod is conducted while the feed rod is horizonal.

8. The method as claimed in claim 1, wherein the lower part comprises a central shaft extending from the central body away from the gripping arms, wherein a counter bearing is arranged on the central shaft, the counter bearing being configured to directly contact the bearing of the upper part to support the lower part, and wherein the upper part has a opening adjacent to the bearing configured to enable lateral entry of the central shaft of the lower part into a central space of the upper part.

9. The method as claimed in claim 1, wherein the lower part comprises an adjusting screw configured to engage with the gripping arms to controllably close and open the griping arms to respectively insert and retract the one end of each of the gripping arms into and out of the groove of the feed rod.

10. The method as claimed in claim 9, wherein the attaching of the lower part to the feed rod takes place outside of the crystal pulling installation while the lower part is separated from the upper part, the upper part being securing mounted on the pulling shaft in the pulling installation, and the attaching comprising operating the adjusting screw to close the gripping arms to insert the one end of each of the gripping arms into the groove of the feed rod.

11. The method as claimed in claim 1, wherein the connecting element comprises a thread configured to engage with the pulling shaft and setting bolts configured to secure the connecting element in position with the pulling shaft.

* * * * *